US012598862B2

(12) United States Patent
Kim et al.

(10) Patent No.: US 12,598,862 B2
(45) Date of Patent: Apr. 7, 2026

(54) WINDOW, DISPLAY PANEL INCLUDING THE WINDOW, AND ELECTRONIC DEVICE INCLUDING THE DISPLAY PANEL

(71) Applicant: SAMSUNG DISPLAY CO., LTD., Yongin-si (KR)

(72) Inventors: Sungwoo Kim, Yongin-si (KR); Mincheol Kim, Yongin-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 845 days.

(21) Appl. No.: 17/898,854

(22) Filed: Aug. 30, 2022

(65) Prior Publication Data

US 2023/0209881 A1     Jun. 29, 2023

(30) Foreign Application Priority Data

Dec. 22, 2021     (KR) ........................ 10-2021-0185414

(51) Int. Cl.
| | |
|---|---|
| *H10K 50/86* | (2023.01) |
| *G02B 1/115* | (2015.01) |
| *H10K 59/122* | (2023.01) |
| *G02B 1/18* | (2015.01) |

(52) U.S. Cl.
CPC ............ *H10K 50/86* (2023.02); *G02B 1/115* (2013.01); *G02B 1/18* (2015.01); *H10K 59/122* (2023.02)

(58) Field of Classification Search
None
See application file for complete search history.

(56) References Cited

U.S. PATENT DOCUMENTS

| | | | | |
|---|---|---|---|---|
| 10,822,271 | B2 | 11/2020 | Adib et al. | |
| 2010/0027123 | A1* | 2/2010 | Imai ...................... | G02B 1/115 |
| | | | | 428/317.9 |
| 2014/0023879 | A1 | 1/2014 | Shibao et al. | |
| 2021/0367189 | A1 | 11/2021 | Hwang et al. | |
| 2022/0123054 | A1* | 4/2022 | Yamazaki .............. | H05B 33/04 |
| 2022/0123072 | A1* | 4/2022 | Kim ...................... | H05K 3/321 |
| 2022/0147102 | A1* | 5/2022 | Kishimoto ............ | G06F 1/1656 |

FOREIGN PATENT DOCUMENTS

| | | |
|---|---|---|
| CN | 211972140 U | 11/2020 |
| JP | 2012252224 A | 12/2012 |
| KR | 1020130114275 A | 10/2013 |
| KR | 101954410 B1 | 3/2019 |
| KR | 1020200123903 A | 11/2020 |
| KR | 1020210144974 A | 12/2021 |

* cited by examiner

*Primary Examiner* — Michelle Mandala
(74) *Attorney, Agent, or Firm* — CANTOR COLBURN LLP

(57) ABSTRACT

A window includes a window substrate, an anti-reflection layer disposed on the window substrate, an anti-fingerprint layer disposed on the anti-reflection layer, and an intermediate layer between the anti-reflection layer and the anti-fingerprint layer. The intermediate layer includes an inorganic insulating material having a columnar crystal structure.

27 Claims, 4 Drawing Sheets

WINDOW, DISPLAY PANEL INCLUDING THE WINDOW, AND ELECTRONIC DEVICE INCLUDING THE DISPLAY PANEL

This application claims priority to Korean Patent Application No. 10-2021-0185414, filed on Dec. 22, 2021, in the Korean Intellectual Property Office, and all the benefits accruing therefrom under 35 U.S.C. § 119, the content of which in its entirety is herein incorporated by reference.

BACKGROUND

1. Field

One or more embodiments relate to a window, a display panel including the window, and an electronic device including the display panel.

2. Description of the Related Art

Various mobile display devices are used. Such display devices may include a display panel that provides an image and a window that protects the display panel.

The window may include a coating layer that reduces the reflectance of light incident from the outside in order to improve visibility.

Also, the window may include a coating layer that protects the display panel from contamination sources such as oil, fingerprints, and various foreign materials.

SUMMARY

One or more embodiments include a window having high hardness, low reflection, and excellent durability. However, this is merely an example, and the scope of the disclosure is not limited thereby.

Additional aspects will be set forth in part in the description which follows and, in part, will be apparent from the description, or may be learned by practice of the presented embodiments of the disclosure.

According to one or more embodiments, a window includes: a window substrate, an anti-reflection layer disposed on the window substrate, an anti-fingerprint layer disposed on the anti-reflection layer, and an intermediate layer between the anti-reflection layer and the anti-fingerprint layer, where the intermediate layer includes an inorganic insulating material having a columnar crystal structure.

In an embodiment, the inorganic insulating material having the columnar crystal structure may include silicon oxide.

In an embodiment, the anti-reflection layer may have a stack structure including a plurality of sub-layers, and the plurality of sub-layers may include a first sub-layer including a first inorganic insulating material and a second sub-layer including a second inorganic insulating material that is different from the first inorganic insulating material.

In an embodiment, the anti-reflection layer may have a structure in which the first sub-layer and the second sub-layer are alternately stacked.

In an embodiment, the first sub-layer may be disposed at an uppermost portion of the anti-reflection layer and may include an oxide.

In an embodiment, the first sub-layer may include an inorganic insulating material having a crystal structure that is different from the columnar crystal structure of the inorganic insulating material of the intermediate layer.

In an embodiment, a density of the intermediate layer may be less than a density of the first sub-layer.

In an embodiment, a thickness of the intermediate layer may be about 1 nanometers (nm) to about 50 nm, and a thickness of the first sub-layer may be about 10 nm to about 500 nm.

In an embodiment, a refractive index of the intermediate layer may be about 1.2 to about 1.7.

According to one or more embodiments, a display panel includes: a substrate, a display element arranged in a display area of the substrate, the display element including a first electrode, a second electrode, and an emission layer between the first electrode and the second electrode, an encapsulation member disposed on the display element, and a window disposed on the encapsulation member, where the window includes: a window substrate, an anti-reflection layer disposed on the window substrate, an anti-fingerprint layer disposed on the anti-reflection layer, and an intermediate layer between the anti-reflection layer and the anti-fingerprint layer. The intermediate layer includes an inorganic insulating material having a columnar crystal structure.

In an embodiment, the inorganic insulating material having the columnar crystal structure may include silicon oxide.

In an embodiment, the anti-reflection layer may have a stack structure including a plurality of sub-layers, and one of the plurality of sub-layers may include an inorganic insulating material having a crystal structure that is different from the columnar crystal structure of the inorganic insulating material of the intermediate layer.

In an embodiment, the anti-reflection layer may have a structure in which a first sub-layer and a second sub-layer are alternately stacked.

In an embodiment, the first sub-layer may be disposed at an uppermost portion of the anti-reflection layer, and the first sub-layer and the intermediate layer may include a same element.

In an embodiment, a material of the first sub-layer may have a crystal structure that is different from the columnar crystal structure of the inorganic insulating material of the intermediate layer, and a density of the intermediate layer may be less than a density of the first sub-layer.

In an embodiment, a thickness of the intermediate layer may be less than a thickness of the first sub-layer.

In an embodiment, a thickness of the intermediate layer may be about 1 nm to about 50 nm, and a thickness of the first sub-layer may be about 10 nm to about 500 nm.

In an embodiment, a refractive index of the intermediate layer may be about 1.2 to about 1.7.

According to one or more embodiments, an electronic device includes a display panel including a display element arranged in a display area of a substrate and a window disposed on the display element, and a housing, which accommodates the display panel, where the window includes: a window substrate, an anti-reflection layer disposed on the window substrate, an anti-fingerprint layer disposed on the anti-reflection layer, and an intermediate layer between the anti-reflection layer and the anti-fingerprint layer. The intermediate layer includes an inorganic insulating material having a columnar crystal structure.

In an embodiment, the inorganic insulating material having the columnar crystal structure may include silicon oxide.

In an embodiment, the anti-reflection layer may have a stack structure including a plurality of sub-layers, and the plurality of sub-layers may include a first sub-layer including a first inorganic insulating material and a second sub-layer including a second inorganic insulating material that is different from the first inorganic insulating material.

In an embodiment, the first sub-layer may include an inorganic insulating material having a crystal structure that is different from the columnar crystal structure of the inorganic insulating material of the intermediate layer.

In an embodiment, the inorganic insulating material of the first sub-layer and the inorganic insulating material of the intermediate layer may include a same element.

In an embodiment, a density of the intermediate layer may be less than a density of the first sub-layer.

In an embodiment, a thickness of the intermediate layer may be less than a thickness of the first sub-layer.

In an embodiment, a thickness of the intermediate layer may be about 1 nm to about 50 nm, and a thickness of the first sub-layer may be about 10 nm to about 500 nm.

In an embodiment, a refractive index of the intermediate layer may be about 1.2 to about 1.7.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
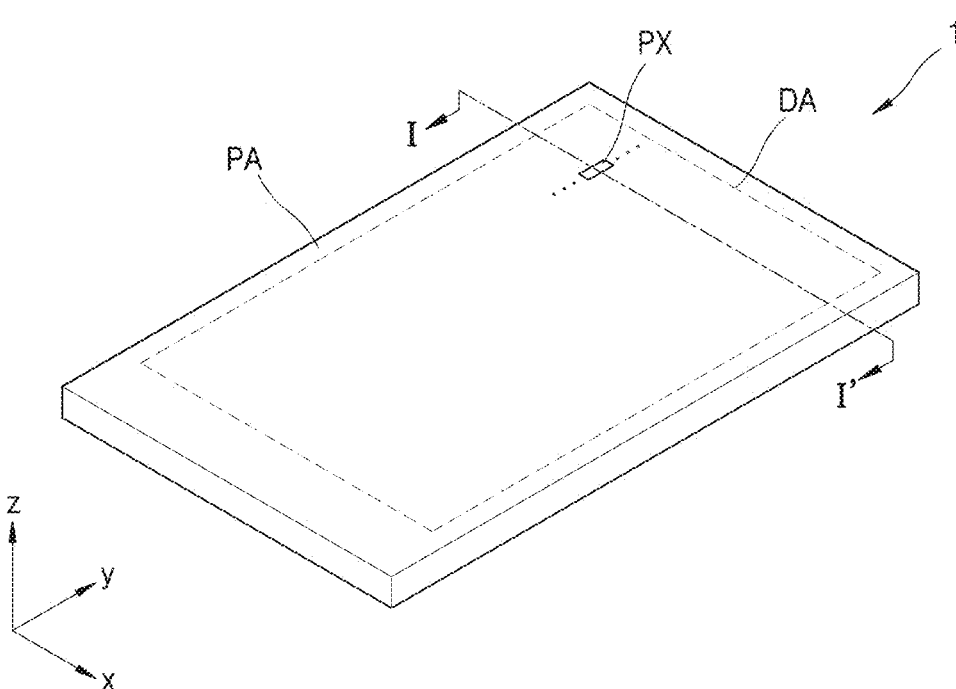
FIG. 1 is a perspective view schematically illustrating an electronic device according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present description allows for various changes and numerous embodiments, certain embodiments will be illustrated in the drawings and described in detail in the written description. Effects and features of the disclosure, and methods of achieving them will be clarified with reference to embodiments described below in detail with reference to the drawings. However, the disclosure is not limited to the following embodiments and may be embodied in various forms.

It will be understood that although the terms "first," "second" etc. may be used herein to describe various elements, these elements should not be limited by these terms. These terms are only used to distinguish one element from another.

The singular forms "a," "an," and "the" as used herein are intended to include the plural forms as well unless the context clearly indicates otherwise.

It will be further understood that the terms "include" and/or "comprise" used herein specify the presence of stated features or elements, but do not preclude the presence or addition of one or more other features or elements.

It will be further understood that, when a layer, region, or element is referred to as being "on" another layer, region, or element, it may be directly or indirectly on the other layer, region, or element. That is, for example, intervening layers, regions, or elements may be present.

Also, sizes of elements in the drawings may be exaggerated or reduced for convenience of explanation. For example, because sizes and thicknesses of elements in the drawings are arbitrarily illustrated for convenience of explanation, the disclosure is not limited thereto.

In this specification, the expression "A and/or B" indicates only A, only B, or both A and B. In this specification, the expression "at least one of A and B" indicates only A, only B, or both A and B.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

In the following embodiments, the expression "a line extends in a first direction or a second direction" may include a case in which "a line extends in a linear shape" and a case in which "a line extends in a zigzag or curved shape in a first direction or a second direction."

In the following embodiments, the term "in a plan view" means a view seeing a target portion from above (i.e., in a z-direction), and the term "in a cross-sectional view" means a view seeing a vertically cut cross-section of a target portion from side. In the following embodiments, the term "overlapping" may include overlapping "in a plan view" and "in a cross-sectional view."

Hereinafter, embodiments will be described in detail with reference to the accompanying drawings. When describing embodiments with reference to the accompanying drawings, the same or corresponding elements are denoted by the same reference numerals.

Figure 2:
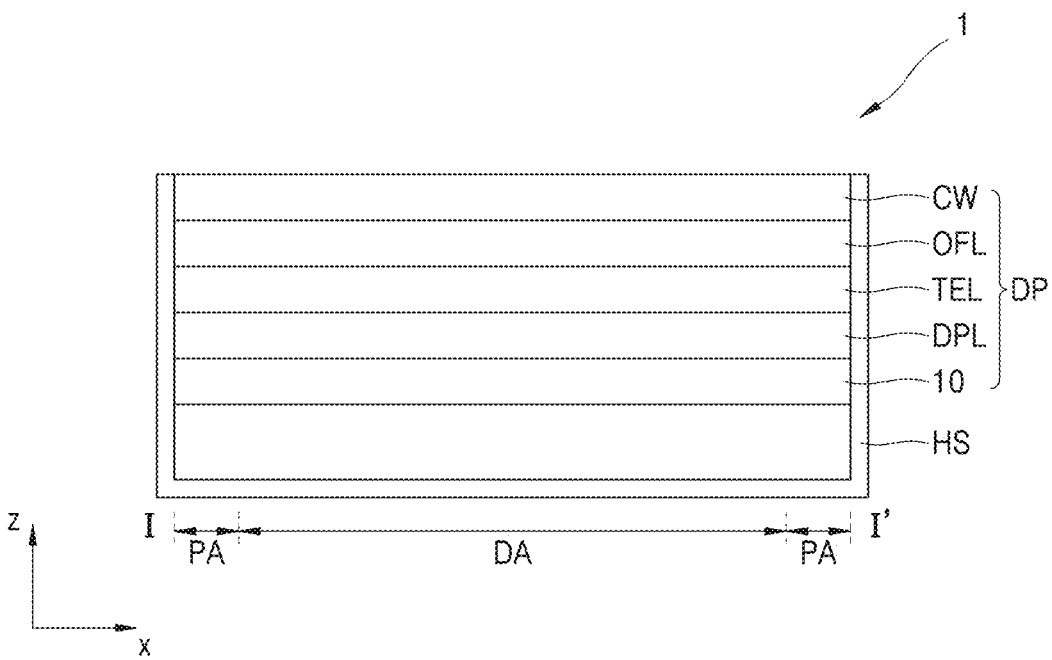
FIG. 2 is a cross-sectional view schematically illustrating an electronic device according to an embodiment.
Figure 3:
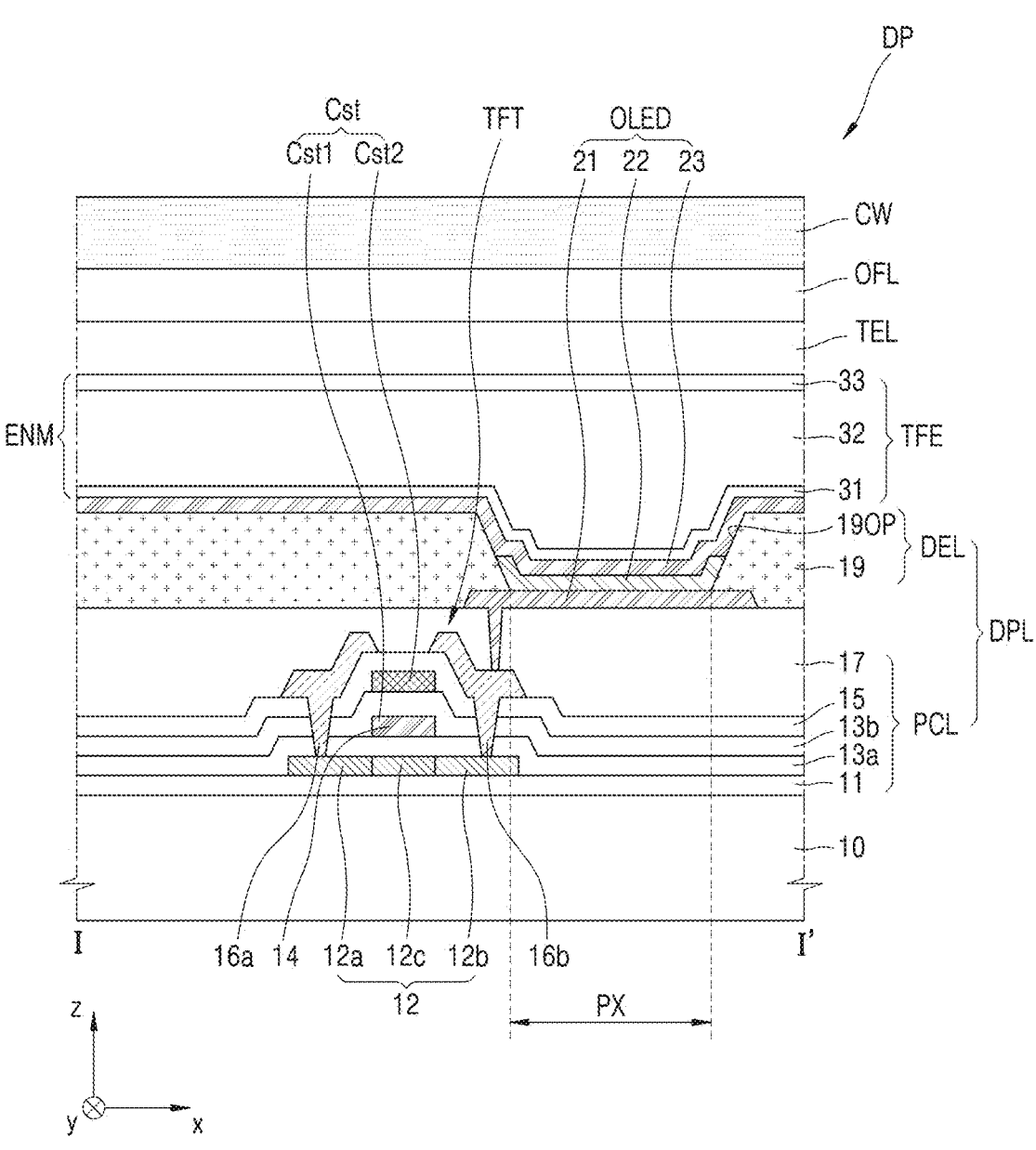
FIG. 3 is a cross-sectional view schematically illustrating a display panel according to an embodiment.

FIG. 1 is a perspective view schematically illustrating an electronic device 1 according to an embodiment, and FIG. 2 is a cross-sectional view of the electronic device 1 taken along line I-I' of FIG. 1, according to an embodiment. FIG. 3 is a cross-sectional view schematically illustrating a display panel DP according to an embodiment.

Referring to FIGS. 1 and 2, the electronic device 1 is configured to display a moving image or a still image, and may be used as display screens of portable electronic devices such as mobile phones, smartphones, tablet personal computers ("PCs"), mobile communication terminals, electronic organizers, e-books, portable multimedia players ("PMPs"), navigations, and ultra mobile PCs ("UMPCs"). Also, the electronic device 1 may be used as display screens of various products such as televisions, laptops, monitors, billboards, and Internet of things ("IoT") devices. Also, the electronic device 1 according to an embodiment may be used in wearable devices such as smart watches, watch phones, glasses type displays, and head mounted displays ("HMDs"). Also, the electronic device 1 according to an embodiment may be used in dashboards of automobiles, center information displays ("CIDs") on the center fascia or dashboards of automobiles, room mirror displays replacing side mirrors of automobiles, and displays on the rear sides of front seats to serve as entertainment devices for backseat passengers of automobiles. For convenience of description, FIG. 1 illustrates that the electronic device 1 according to an embodiment is used as a smartphone.

The electronic device 1 may have a rectangular shape in a plan view. For example, the electronic device 1 may have a rectangular planar shape having a short side in an x-direction and a long side in a y-direction, as illustrated in FIG. 1. An edge where the short side in the x-direction and the long side in the y-direction meet may be round to have a certain curvature, or may be at a right angle. The planar shape of the electronic device 1 is not limited to the rectangular shape, and may be other polygonal, elliptical, or irregular shapes.

Referring to FIG. 2, the electronic device 1 may include a housing HS and the display panel DP. The housing HS may accommodate the display panel DP. Although FIG. 2 illustrates that the housing HS integrally surrounds the edges of the display panel DP, but the disclosure according to the invention is not limited thereto. In another embodiment, the housing HS may not be integral, and may be provided with two or more members coupled to each other. Also, in addition to the display panel DP, components for driving the electronic device 1, for example, a power supply such as a battery, a circuit board, or the like, may be mounted inside the housing HS.

The display panel DP may include a display area DA and a peripheral area PA outside the display area DA. The display panel DP may provide an image through an array of a plurality of sub-pixels PX arranged in the display area DA. The sub-pixel PX may include a display element (or a light-emitting element) electrically connected to a sub-pixel circuit. The display element may include a light-emitting diode, for example, an organic light-emitting diode including an organic emission layer.

The sub-pixel PX may emit red light, green light, or blue light. Alternatively, the sub-pixel PX may emit red light, green light, blue light, or white light.

Referring to FIGS. 2 and 3, the display panel DP may include a structure in which a substrate 10, a display layer DPL, a touch electrode layer TEL, an optical function layer OFL, and a window CW are stacked in this order. The display layer DPL may include a pixel circuit layer PCL including a thin-film transistor TFT, a display element layer DEL including a display element, and an encapsulation member ENM such as a thin-film encapsulation layer TFE or an encapsulation substrate (not illustrated). Insulating layers may be disposed in the display layer DPL and between the substrate 10 and the display layer DPL. The display element may include a light-emitting diode. In an embodiment, FIG. 3 illustrates that the display element is an organic light emitting diode OLED. Although a case in which the electronic device 1 includes the organic light-emitting diode OLED as the display element has been described below, the disclosure according to the invention is not limited thereto. In another embodiment, the display element may be a light-emitting diode including an inorganic material or a quantum dot light-emitting diode including quantum dots. For example, an emission layer of the display element may include an organic material, an inorganic material, quantum dots, an organic material and quantum dots, or an inorganic material and quantum dots.

The substrate 10 may include glass or polymer resin. In this case, the polymer resin may include at least one selected from polyethersulfone, polyarylate, polyether imide, polyethylene naphthalate, polyethylene terephthalate, polyphenylene sulfide, polyimide, polycarbonate, cellulose triacetate, and cellulose acetate propionate.

The pixel circuit layer PCL may be disposed on the substrate 10. FIG. 3 illustrates that the pixel circuit layer PCL includes the thin-film transistor TFT, and a buffer layer 11, a first insulating layer 13a, a second insulating layer 13b, a third insulating layer 15, and a planarization layer 17, which are disposed below or/and above components of the thin-film transistor TFT.

The buffer layer 11 may reduce or prevent infiltration of foreign material, moisture, or ambient air from below the substrate 10, and may provide a flat surface on the substrate 10. The buffer layer 11 may include an inorganic insulating material such as silicon nitride, silicon oxynitride, and silicon oxide, and may include a single layer or layers including the above-described inorganic insulating material.

The thin film transistor TFT on the buffer layer 11 may include a semiconductor layer 12, and the semiconductor layer 12 may include polysilicon. Alternatively, the semiconductor layer 12 may include amorphous silicon, an oxide semiconductor, or an organic semiconductor. The semiconductor layer 12 may include a channel region 12c, and a drain region 12a and a source region 12b, which are arranged on opposite sides of the channel region 12c, respectively. A gate electrode 14 may overlap the channel region 12c in a plan view.

The gate electrode 14 may include a low-resistance metal material. The gate electrode 14 may include a conductive material including molybdenum (Mo), aluminum (Al), copper (Cu), titanium (Ti), or the like, and may include a single layer or layers including the above-described conductive material.

The first insulating layer 13a may be between the semiconductor layer 12 and the gate electrode 14. The first insulating layer 13a may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$).

The second insulating layer 13b may cover the gate electrode 14. The second insulating layer 13b may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$).

An upper electrode Cst2 of a storage capacitor Cst may be disposed on the second insulating layer 13b. The upper electrode Cst2 may at least partially overlap the gate electrode 14 disposed therebelow in a plan view. The gate electrode 14 and the upper electrode Cst2, which overlap each other with the second insulating layer 13b therebetween, may form the storage capacitor Cst. That is, the gate electrode 14 may function as a lower electrode Cst1 of the storage capacitor Cst.

As described above, the storage capacitor Cst and the thin film transistor TFT may overlap each other. Alternatively, in an embodiment, the storage capacitor Cst may not overlap the thin-film transistor TFT in a plan view. That is, the lower electrode Cst1 of the storage capacitor Cst is a separate component from the gate electrode 14 and may be apart from the gate electrode 14.

The upper electrodes Cst2 may include aluminum (Al), platinum (Pt), palladium (Pd), silver (Ag), magnesium (Mg), gold (Au), nickel (Ni), neodymium (Nd), iridium (Ir), chromium (Cr), calcium (Ca), molybdenum (Mo), titanium (Ti), tungsten (W), and/or copper (Cu), and may include a single layer or layers including the above-described material.

The third insulating layer 15 may cover the upper electrode Cst2. The third insulating layer 15 may include an inorganic insulating material such as silicon oxide ($SiO_x$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_x$). The third insulating layer 15 may include a single layer or layers including the above-described inorganic insulating material.

A drain electrode 16a and a source electrode 16b may be disposed on the third insulating layer 15. The drain electrode 16a and the source electrode 16b may be connected to the drain region 12a and the source region 12b, respectively, through contact holes defined in the insulating layers therebelow. The drain electrode 16a and the source electrode 16b may include a material having good conductivity. The drain electrode 16a and the source electrode 16b may include a conductive material including molybdenum (Mo), aluminum (Al), copper (Cu), titanium (Ti), or the like, and may include a single layer or layers including the above-described conductive material. In an embodiment, the drain electrode 16a and the source electrode 16b may have a multi-layer structure of Ti/Al/Ti.

The planarization layer 17 may include an organic insulating material. The planarization layer 17 may include an organic insulating material such as general-purpose polymer such as polymethylmethacrylate ("PMMA") or polystyrene ("PS"), polymer derivatives having a phenolic group, acrylic polymer, imide polymer, aryl ether polymer, amide polymer, fluorine polymer, p-xylene polymer, vinyl alcohol polymer, and any blend thereof.

The display element layer DEL may be disposed on the pixel circuit layer PCL having the above-described structure. The display element layer DEL may include the organic light-emitting diode OLED as the display element, and the organic light-emitting diode OLED may include a structure in which a pixel electrode 21, an emission layer 22, and a common electrode 23 are stacked. The pixel electrode 21 of the organic light-emitting diode OLED may be electrically connected to the thin-film transistor TFT through a contact hole defined in the planarization layer 17.

The pixel electrode 21 may include a conductive oxide such as indium tin oxide ("ITO"), indium zinc oxide ("IZO"), zinc oxide (ZnO), indium oxide ($In_2O_3$), indium gallium oxide ("IGO"), or aluminum zinc oxide ("AZO"). In an embodiment, the pixel electrode 21 may include a reflective layer including silver (Ag), magnesium (Mg), aluminum (Al), platinum (Pt), palladium (Pd), gold (Au), nickel (Ni), neodymium (Nd), iridium (Ir), chromium (Cr), or any compound thereof. Alternatively, in an embodiment, the pixel electrode 21 may further include a layer including ITO, IZO, ZnO, or $In_2O_3$ above and/or below the reflective layer.

A bank layer 19 defining an opening 19OP exposing at least a portion of the pixel electrode 21 may be disposed on the pixel electrode 21. The bank layer 19 may include an organic insulating material and/or an inorganic insulating material. The opening 19OP may define an emission area of light emitted from the organic light-emitting diode OLED. For example, the size and/or width of the opening 19OP may correspond to the size and/or width of the emission area. Accordingly, the size and/or width of the sub-pixel PX may depend on the size and/or width of the opening 19OP of the bank layer 19 corresponding thereto.

The emission layer 22 may be arranged in the opening 19OP of the bank layer 19. The emission layer 22 may include a high molecular weight organic material or a low molecular weight organic material that emits light of a certain color. Alternatively, the emission layer 22 may include an inorganic light-emitting material or quantum dots.

Although not illustrated, a first functional layer and a second functional layer may be disposed below and above the emission layer 22, respectively. For example, the first functional layer may include a hole transport layer ("HTL"), or may include an HTL and a hole injection layer ("HIL"). The second functional layer may include an electron transport layer ("ETL") and/or an electron injection layer ("EIL"). However, the disclosure according to the invention is not limited thereto. The first functional layer and the second functional layer may be optionally disposed above and below the emission layer 22, respectively, in another embodiment.

The first functional layer and/or the second functional layer may be a common layer completely covering the substrate 10, like a common electrode 23 to be described below.

The common electrode 23 may be disposed on the pixel electrode 21 and may overlap the pixel electrode 21 in a plan view. The common electrode 23 may include a conductive material having a low work function. For example, the common electrode 23 may include a (semi) transparent layer including silver (Ag), magnesium (Mg), aluminum (Al), platinum (Pt), palladium (Pd), gold (Au), nickel (Ni), neodymium (Nd), iridium (Ir), chromium (Cr), lithium (Li), calcium (Ca), or any alloy thereof. Alternatively, the common electrode 23 may further include a layer such as ITO, IZO, ZnO, or $In_2O_3$ on the (semi) transparent layer including the above-described material. The common electrode 23 may be integrally provided to completely cover the substrate 10.

The encapsulation member ENM may be disposed on the display element layer DEL. In an embodiment, the encapsulation member ENM may include the thin-film encapsulation layer TFE, as illustrated in FIG. 3. However, the disclosure according to the invention is not limited thereto. In another embodiment, the encapsulation member ENM may be provided as an encapsulation substrate. For example, the encapsulation substrate may be provided as glass. In an embodiment, the glass may be ultra-thin glass ("UTG").

The thin-film encapsulation layer TFE may be disposed on the display element layer DEL, and may cover the display element layer DEL. The thin-film encapsulation layer TFE may include at least one inorganic layer and at least one organic layer. In an embodiment, the thin-film encapsulation layer TFE may include a first inorganic layer 31, an organic layer 32, and a second inorganic layer 33, which are sequentially stacked. The first inorganic layer 31 and the second inorganic layer 33 may include at least one inorganic material selected from aluminum oxide, titanium oxide, tantalum oxide, hafnium oxide, zinc oxide, silicon oxide, silicon nitride, and silicon oxynitride. The organic layer 32 may include a polymeric material. The polymeric material may include acrylic resin, epoxy resin, polyimide, polyethylene, or the like. In an embodiment, the organic layer 32 may include acrylate. The organic layer 32 may be formed by curing a monomer or applying a polymer.

The touch electrode layer TEL may be disposed on the encapsulation member ENM, for example, the thin-film encapsulation layer TFE. The touch electrode layer TEL may be configured to obtain coordinate information according to an external input, for example, a touch event. The touch electrode layer TEL may include a touch electrode and signal lines (trace lines) connected to the touch electrode.

The touch electrode layer TEL may be configured to sense an external input by using a mutual cap method and/or a self-cap method.

The touch electrode layer TEL may be directly formed on the display element layer DEL, or may be separately formed and then coupled to the display element layer DEL through an adhesive member such as an optical clear adhesive ("OCA"). FIGS. 2 and 3 illustrate that the touch electrode layer TEL is between the display element layer DEL and the optical function layer OFL, but in another embodiment, the touch electrode layer TEL may be disposed on the optical function layer OFL.

The optical function layer OFL may reduce the reflectance of light (external light) incident from the outside toward the electronic device 1, and may improve the color purity of light emitted from the electronic device 1. In an embodiment, the optical function layer OFL may include a retarder and/or a polarizer. The retarder may be a film-type retarder or a liquid crystal coating-type retarder, and may include a $\lambda/2$ retarder and/or a $\lambda/4$ retarder. Also, the polarizer may be a film-type polarizer or a liquid crystal coating-type polarizer. The film-type polarizer may include a stretched synthetic resin film, and the liquid crystal coating-type polarizer may include liquid crystals arranged in a certain array.

In an embodiment, the optical function layer OFL may include a destructive interference structure. The destructive interference structure may include a first reflective layer and a second reflective layer on different layers from each other. First reflected light and second reflected light reflected from the first reflective layer and the second reflective layer, respectively, may destructively interfere with each other, and thus, the reflectance of external light may be reduced.

An adhesive member may be between the touch electrode layer TEL and the optical function layer OFL. As the adhesive member, any general adhesive members known in the art may be employed without limitation. For example, the adhesive member may be an OCA.

The window CW may be disposed on the optical function layer OFL. The window CW may be directly formed on the optical function layer OFL, or may be separately formed and then bonded to the optical function layer OFL by an adhesive member therebetween. The adhesive member may be, for example, an OCA.

Figure 4:
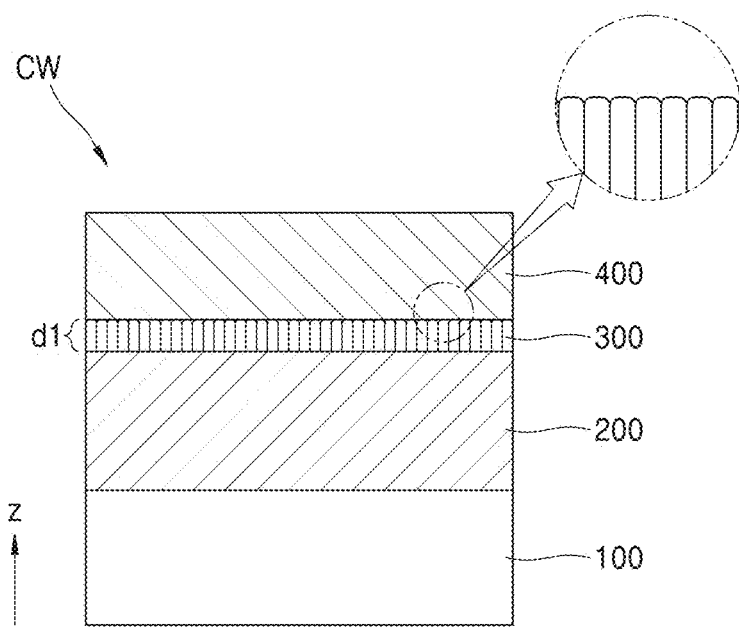
FIG. 4 is a cross-sectional view schematically illustrating a window according to an embodiment.
Figure 5:
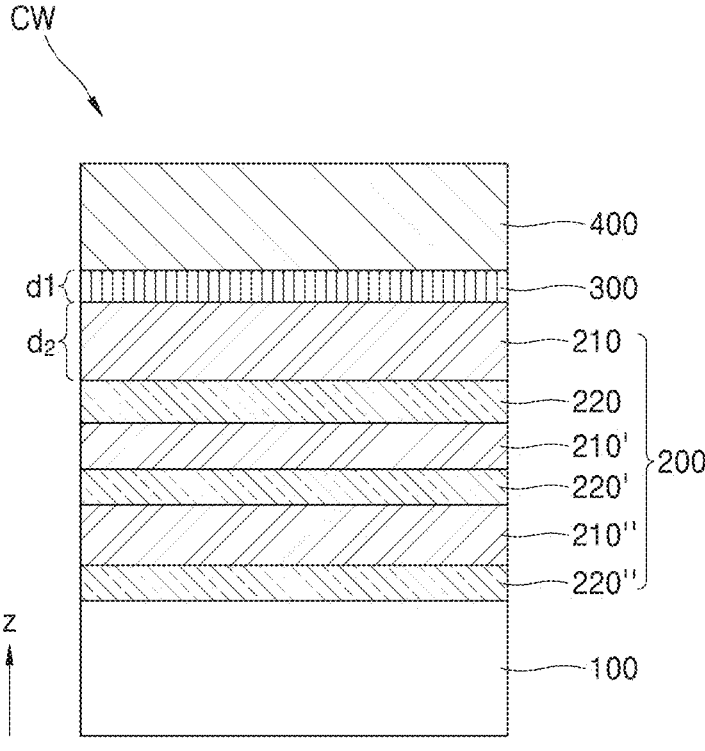
FIG. 5 is a cross-sectional view schematically illustrating a window according to an embodiment.

FIG. 4 is a cross-sectional view schematically illustrating a window CW according to an embodiment, and FIG. 5 is a cross-sectional view schematically illustrating a window CW according to an embodiment.

Referring to FIG. 4, the window CW may include a window substrate 100, an anti-reflection layer 200, an intermediate layer 300, and an anti-fingerprint layer 400.

The window substrate 100 may include glass or polymer resin. In an embodiment, the window substrate 100 may include, for example, a polymer resin such as polyether-sulfone, polyacrylate, polyether imide, polyethylene naphthalate, polyethylene terephthalate, polyphenylene sulfide, polyarylate, polyimide, polycarbonate, or cellulose acetate propionate. In an embodiment, the window substrate 100 may include UTG, the strength of which is increased by chemical strengthening or thermal strengthening.

The anti-reflection layer 200 may be disposed on the window substrate 100. The anti-reflection layer 200 may reduce the reflectance of light incident from the outside.

The anti-reflection layer 200 may have a stack structure including a plurality of sub-layers. In an embodiment, the anti-reflection layer 200 may include a first sub-layer 210 including a first inorganic insulating material, and a second sub-layer 220 including a second inorganic insulating material that is different from the first inorganic insulating material. In an embodiment, the first inorganic insulating material may have a refractive index that is different from a refractive index of the second inorganic insulating material. When the refractive index of the first inorganic insulating material is n1 and the refractive index of the second inorganic insulating material is n2, there is a relation: n1<n2. In an embodiment, the refractive index n1 of the first inorganic insulating material included in the first sub-layer 210 may be, for example, about 1.2 to about 1.7. In an embodiment, the refractive index n2 of the second inorganic insulating material included in the second sub-layer 220 may be, for about 1.5 to about 2.6.

Also, in an embodiment, at least one sub-layer of the anti-reflection layer 200 may include a material having high hardness properties. For example, the second inorganic insulating material of the second sub-layer 220 may be a material having a high refractive index and high hardness properties.

The first inorganic insulating material may include an oxide, for example, silicon oxide ($SiO_x$). In an embodiment, the first inorganic insulating material may include silica ($SiO_2$). The second inorganic insulating material include, for example, at least one selected from silicon nitride ($SiN_x$), silicon oxynitride (SiON), aluminum nitride (AlN), aluminum oxide ($Al_2O_3$), aluminum silicon nitride (Al—Si—N), and any combination thereof. In an embodiment, the second inorganic insulating material may include silicon nitride ($SiN_x$).

Referring to FIG. 5, in an embodiment, the anti-reflection layer 200 may have a structure in which the first sub-layer 210 and the second sub-layer 220 are alternately stacked. In some embodiments, FIG. 5 illustrates that the second sub-layer 220 includes three first sub-layers 210, 210', and 210" and three second sub-layers 220, 220', and 220". Hereinafter, for convenience of description, the three first sub-layers 210, 210', and 210" are referred to as a (1-1)th sub-layer 210, a (1-2)th sub-layer 210', and a (1-3)th sub-layer 210", respectively, and the three second sub-layers 220, 220', and 220" are referred to as a (2-1)th sub-layer 220, a (2-2)th sub-layer 220', and a (2-3)th sub-layer 220", respectively.

The (1-1)th sub-layer 210, the (1-2)th sub-layer 210', and the (1-3)th sub-layer 210" illustrated in FIG. 5 may include inorganic insulating materials including the same element. In an embodiment, the (1-1)th sub-layer 210, the (1-2)th sub-layer 210', and the (1-3)th sub-layer 210" may include silicon oxide ($SiO_x$), for example, silica ($SiO_2$).

The (1-1)th sub-layer 210, the (1-2)th sub-layer 210', and the (1-3)th sub-layer 210" may have a crystal structure that is different from a crystal structure of the intermediate layer 300. In an embodiment, while the intermediate layer 300 has a columnar crystal structure, the (1-1)th sub-layer 210, the (1-2)th sub-layer 210', and the (1-3)th sub-layer 210" may have, for example, a plate-like crystal structure.

A density of each of the (1-1)th sub-layer 210, the (1-2)th sub-layer 210', and the (1-3)th sub-layer 210" may be greater than a density of the intermediate layer 300. In an embodiment, when the (1-1)th sub-layer 210, the (1-2)th sub-layer 210', and the (1-3)th sub-layer 210" have a plate-like crystal structure that is different from a crystal structure of the intermediate layer 300, a packing density of each of the (1-1)th sub-layer 210, the (1-2)th sub-layer 210', and the (1-3)th sub-layer 210" may be greater than a packing density of the intermediate layer 300 having a columnar crystal structure.

The (1-1)th sub-layer 210, the (1-2)th sub-layer 210', and the (1-3)th sub-layer 210" may have different thicknesses from each other. In some embodiments, a thickness d2 of the (1-1)th sub-layer 210 may be greater than a thickness of the (1-2)th sub-layer 210' and greater than a thickness of the (1-3)th sub-layer 210". For example, the thickness d2 of the (1-1)th sub-layer 210 may be about 66 nm, the thickness of the (1-2)th sub-layer 210' may be about 10 nm, and thickness of the (1-3)th sub-layer 210 may be about 26 nm.

The (2-1)th sub-layer 220, the (2-2)th sub-layer 220', and the (2-3)th sub-layer 220" may include inorganic insulating materials including the each same element. For example, in an embodiment, the (2-1)th sub-layer 220, the (2-2)th sub-layer 220', and the (2-3)th sub-layer 220" may include silicon nitride ($SiN_x$).

FIG. 5 illustrates that the uppermost layer of the anti-reflection layer 200 includes the first sub-layer (e.g., the (1-1)th sub-layer 210) including an element that is identical to an element of the intermediate layer 300. In this case, compared with the case in which the uppermost layer of the anti-reflection layer 200 includes an element that is different from an element of the intermediate layer 300, the bonding strength between the anti-reflection layer 200 and the intermediate layer 300 may be improved.

Although FIG. 5 illustrates that the anti-reflection layer 200 has a six-layer structure, but the disclosure according to the invention is not limited thereto. The anti-reflection layer 200 may include various numbers of sub-layers. The anti-reflection layer 200 may have, for example, a five-layer structure or an eight-layer structure.

In an embodiment, the anti-reflection layer 200 includes the first sub-layer 210 and the second sub-layer 220 including materials having different refractive indices from each other, and has a structure in which the first sub-layer 210 and the second sub-layer 220 are stacked. Therefore, the anti-reflection layer 200 may exhibit low reflection characteristics. Specifically, the path of light incident from the outside may be changed while the light passes through the sub-layers of the anti-reflection layer 200 having different refractive indices from each other. Pieces of light reflected from the sub-layers of the anti-reflection layer 200, for example, the first sub-layer 210 and the second sub-layer 220, may destructively interfere with each other. Accordingly, the reflectance of external light may be reduced. Also, in an embodiment, because at least one sub-layer of the anti-reflection layer 200, for example, the second sub-layer 220, includes a material having high hardness properties, an anti-reflection layer having improved hardness properties may be provided.

The anti-reflection layer 200 may be formed by, for example, sputtering, atomic layer deposition ("ALD"), spin coating, or pulsed laser deposition. In an embodiment, the anti-reflection layer 200 may be formed by sputtering. The use of sputtering may make it easy to form the anti-reflection layer 200 in a multi-layer structure.

The sub-layer disposed at the uppermost portion in the stack structure of the anti-reflection layer 200, that is, the sub-layer disposed closest to the intermediate layer 300, for example, the first sub-layer 210 may include an inorganic insulating material having a crystal structure that is different from a crystal structure of an inorganic insulating material of the intermediate layer 300, as described below. In an embodiment, the first sub-layer 210 of the anti-reflection layer 200 may include silicon oxide ($SiO_x$) having a plate-like crystal structure.

The anti-fingerprint layer 400 may be disposed above the anti-reflection layer 200. In an embodiment, the anti-fingerprint layer 400 may include a material that is different from a material of the anti-reflection layer 200. The anti-finger-print layer 400 may include a fluorine-based silane compound. In an embodiment, the anti-fingerprint layer 400 may include a compound (or a material) in which perfluoropolyether ("PFPE") and $Si—OX$ (X: methoxy, ethoxy, etc.) are bonded to each other. However, the disclosure is not limited thereto.

The anti-fingerprint layer 400 may be formed by, for example, electron-beam deposition (E-beam, electron-beam vapor deposition), sputtering, thermal deposition, spin coating, or the like. In an embodiment, the anti-fingerprint layer 400 may be formed by E-beam.

The intermediate layer 300 may be between the anti-reflection layer 200 and the anti-fingerprint layer 400. The intermediate layer 300 may include an inorganic insulating material having a columnar crystal structure. For example, the intermediate layer 300 may include an oxide (a compound including an oxygen element and other elements) having a columnar crystal structure. In an embodiment, the intermediate layer 300 may include silicon oxide ($SiO_x$) having a columnar crystal structure. In an embodiment, the refractive index of the intermediate layer 300 may be about 1.2 to about 1.7.

Referring to FIG. 4, when the intermediate layer 300 has a columnar crystal structure, each column extending in the z-direction, the upper portions of the columnar crystals may exhibit a concave-convex structure (i.e., protrusion and depression) on the upper surface of the intermediate layer 300. Therefore, when the intermediate layer 300 has a columnar crystal structure, the surface roughness of the intermediate layer 300 may be increased, compared with the case in which the intermediate layer 300 has a plate-like crystal structure. Also, when the anti-fingerprint layer 400 is deposited on the intermediate layer 300, the surface area of the intermediate layer 300, to which a functional group for bonding the anti-fingerprint layer 400 to other layers may be connected, may be increased.

The intermediate layer 300 may be formed on the anti-reflection layer 200 by E-beam or sputtering. In an embodiment, the intermediate layer 300 may be formed by E-beam. The use of E-beam may make it easy to form the intermediate layer 300 in a columnar crystal structure.

TABLE 1

| shows the contact angle measurement results of Comparative Examples 1-1 to 1-3 and Experimental Examples 1-1 to 1-3. | | | |
|---|---|---|---|
| | Initial contact angle (°) | Contact angle (°) after alcohol resistance evaluation | Determination after drug resistance evaluation |
| Comparative Example 1-1 | 118.1 | 90.7 | X |
| Comparative Example 1-2 | 117.8 | 91.1 | X |
| Comparative Example 1-3 | 117.2 | 89 | X |
| Experimental Example 1-1 | 116.7 | 114.8 | ○ |
| Experimental Example 1-2 | 116.6 | 111.1 | ○ |
| Experimental Example 1-3 | 116.0 | 111.8 | ○ |

In Comparative Examples 1-1 to 1-3, a layer including silicon oxide ($SiO_x$) and a layer including silicon nitride ($SiN_x$) were alternately stacked on a window substrate, and an anti-reflection layer including silicon oxide ($SiO_x$) was formed at the uppermost portion by sputtering. Silicon oxide ($SiO_x$) included in the uppermost layer was formed to have a plate-like crystal structure. An anti-fingerprint layer including $Si—OX$ (X: methoxy, ethoxy, etc.) was formed on the anti-reflection layer. Specifically, the anti-fingerprint layer having a structure in which PFPE and Si—OX were bonded to each other was formed by using electron-beam deposition.

In Experimental Examples 1-1 to 1-3, a layer including silicon oxide ($SiO_x$) and a layer including silicon nitride ($SiN_x$) were alternately stacked on a window substrate, and an anti-reflection layer including silicon oxide ($SiO_x$) was formed at the uppermost portion by sputtering. Silicon oxide ($SiO_x$) included in the uppermost layer was formed to have a plate-like crystal structure. An intermediate layer including an inorganic insulating material having a columnar crystal structure was formed on the anti-reflection layer. Specifically, silicon oxide ($SiO_x$) having a columnar crystal structure was formed on the anti-reflection layer by electron-beam deposition. An anti-fingerprint layer including Si—OX (X: methoxy, ethoxy, etc.) was formed on the intermediate layer having a columnar crystal structure. Specifically, the anti-fingerprint layer having a structure in which PFPE and Si—OX were bonded was formed by using electron-beam deposition.

Thereafter, initial contact angle evaluation and alcohol resistance evaluation were performed on Comparative Examples 1-1 to 1-3 and Experimental Examples 1-1 to 1-3. At this time, when the contact angle of the anti-fingerprint layer with respect to water was less than 95 degrees (°), it was determined as "out of spec." Therefore, when the contact angle of the anti-fingerprint layer with respect to water was 95 degrees or more, it was determined that the evaluation criteria were satisfied. "Out of spec" is indicated by X, and the case in which the evaluation criteria were satisfied is indicated by O.

First, for initial contact angle evaluation, 3 ul of water was dropped on the surface of the anti-fingerprint layer that was not chemically treated, and then, the contact angle of the anti-fingerprint layer with respect to water was measured. For alcohol resistance evaluation, after rubbing 1000 times (40 times/min) by using a rubber eraser (Minoan) to which a load of 500 grams (g) was applied under ethyl alcohol conditions (99.9 percentages (%)), the contact angle of the anti-fingerprint layer with respect to water was measured. For example, the contact angle of the surface of the anti-fingerprint layer with respect to water was measured.

Referring to Table 1, it may be confirmed that the initial contact angles of Comparative Examples 1-1 to 1-3 and Experimental Examples 1-1 to 1-3 are all measured to be 95 degrees (°) or more.

As a result of the alcohol resistance evaluation, the contact angles of Comparative Examples 1-1, 1-2, and 1-3 with respect to water were measured to be 90.7 degrees, 91.1 degrees, and 89 degrees, respectively, and the alcohol resistance contact angles of Comparative Examples 1-1, 1-2, and 1-3 each are less than 95 degrees. Therefore, it may be confirmed that Comparative Examples 1-1, 1-2, and 1-3 do not satisfy the evaluation criteria (e.g., 95 degrees (°) or more). On the other hand, as a result of the alcohol resistance evaluation, the contact angles of Experimental Examples 1-1, 1-2, and 1-3 with respect to water were all measured to be 110 degrees or more. Therefore, it may be confirmed that Experimental Examples 1-1, 1-2, and 1-3 satisfy the evaluation criteria (e.g., 95 degrees (°) or more).

Therefore, when an intermediate layer including an inorganic insulating material having a columnar crystal structure is between the anti-reflection layer and the anti-fingerprint layer, it may be confirmed that the alcohol resistance of the anti-fingerprint layer is improved, compared with the case in which the anti-fingerprint layer is directly on the anti-reflection layer. Specifically, when an intermediate layer including silicon oxide ($SiO_x$) having a columnar crystal structure is between the anti-reflection layer and the anti-fingerprint layer, it may be confirmed that the durability of the anti-fingerprint layer is effectively improved, compared with the case in which the anti-fingerprint layer is disposed on the uppermost layer of the anti-reflection layer including silicon oxide ($SiO_x$) having a plate-like crystal structure.

In an embodiment, in the structure in which PFPE and Si—OX (X: methoxy, ethoxy, etc.) included in the anti-fingerprint layer 400 are bonded to each other, —OX may be bonded to an OH group on the surface of silicon oxide ($SiO_x$) of the intermediate layer 300 through a condensation reaction. In this case, when silicon oxide ($SiO_x$) included in the intermediate layer 300 has a columnar crystal structure, the functional groups of the anti-fingerprint layer 400 may be bonded to OH groups on the upper and/or side surfaces of the columnar crystals. Therefore, because the intermediate layer 300 has a columnar crystal structure, the surface area may increase, and thus, the number of chemical bonds formed between the anti-fingerprint layer 400 and the intermediate layer 300 may relatively increase. Therefore, the adhesive strength of the anti-fingerprint layer 400 may be improved. Due to this, the durability of the anti-fingerprint layer may be improved.

In an embodiment, because the durability of the window including the anti-fingerprint layer is improved, the display panel on which the display element is disposed may be effectively protected from contamination sources including oil, fingerprints, and various foreign materials.

In an embodiment, referring to FIG. 5, when an intermediate layer 300 having a columnar crystal structure is between an anti-reflection layer 200 and an anti-fingerprint layer 400, the optical properties of a window CW in a visible light wavelength band, for example, reflectance or chrominance may be changed. The visible light wavelength band may refer to a wavelength band of about 400 nm to about 700 nm. In order to compensate for the changed optical properties of the window CW, a thickness of the anti-reflection layer 200 may be adjusted according to a thickness d1 of the intermediate layer 300 in the z-direction. For example, a thickness d2 of a first sub-layer 210 disposed at the uppermost portion of the anti-reflection layer 200 may be adjusted. When a thickness of a sub-layer disposed in the middle among the sub-layers of the anti-reflection layer 200 is adjusted, it is also desirable to adjust thicknesses of the sub-layers located above and below a target sub-layer. Therefore, it may be cost-effective in design and process to adjust the thickness of the sub-layer disposed at the uppermost portion of the anti-reflection layer 200.

In an embodiment, a density of the intermediate layer 300 may be less than a density of the first sub-layer 210. In an embodiment, in the case in which the intermediate layer 300 includes silicon oxide ($SiO_x$) having a columnar crystal structure and the first sub-layer 210 includes silicon oxide ($SiO_x$) having a plate-like crystal structure, the packing density of the intermediate layer 300 may be reduced to about 0.7, for example, on the assumption that the packing density of the first sub-layer 210 is 1. In the case of the columnar crystal structure, gaps may be formed between the columnar crystals. Therefore, the density of the columnar crystal structure may be less than the density of the plate-like crystal structure. In the columnar crystal structure, as the packing density decreases, the path of light incident from the outside may be changed, compared with the plate-like crystal structure. Accordingly, an optical thickness may be changed. Therefore, in order to achieve desired optical properties such as reflectance or chrominance, the thickness of the first sub-layer 210 may be adjusted according to the thickness of the intermediate layer 300.

In an embodiment, in the case in which the intermediate layer 300 includes silicon oxide ($SiO_x$) having a columnar crystal structure and the first sub-layer 210 includes silicon oxide ($SiO_x$) having a plate-like crystal structure, when the thickness of the first sub-layer 210 is d2' on the assumption that the intermediate layer 300 includes silicon oxide ($SiO_x$) having a plate-like crystal structure, the thickness d2 of the first sub-layer 210 compensating for the optical properties changed due to the columnar crystal structure may has a relationship as shown in Equation 1 below with respect to the thickness d1 of the intermediate layer 300 having a columnar crystal structure.

$$d2=d2'-d1*A \qquad \text{<Equation 1>}$$

A is 1 or more and 1.4 or less.

In an embodiment, the thickness d1 of the intermediate layer 300 may be about 1 nm to about 50 nm in the z-direction. In some embodiments, the thickness d1 of the intermediate layer 300 may be about 1 nm to about 20 nm. When the thickness d1 of the intermediate layer 300 is less than about 1 nm, layer formation and thickness control in a columnar crystal structure may be difficult. In contrast, when the thickness of the intermediate layer 300 is greater than about 50 nm, time and cost may be excessively required and process control may be difficult.

In an embodiment, the thickness d1 of the intermediate layer 300 may be less than the thickness d2 of the first sub-layer 210. In an embodiment, the thickness d2 of the first sub-layer 210 may be about 10 to about 500 nm. In some embodiments, the thickness d2 of the first sub-layer 210 may be about 10 nm to about 100 nm. When the thickness d2 of the first sub-layer 210 is less than about 10 nm in the z-direction, layer formation and thickness control may be difficult. When the thickness of the first sub-layer 210 is greater than about 500 nm, processing time and cost may be excessively required and hardness properties of the anti-reflection layer may be deteriorated.

According to one or more embodiments, the window having high hardness and low reflection properties and excellent durability, the display panel including the window, and the electronic device including the display panel may be implemented. The scope of the disclosure is not limited by such an effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A window comprising:
a window substrate;
an anti-reflection layer disposed on the window substrate;
an anti-fingerprint layer disposed on the anti-reflection layer; and
an intermediate layer between the anti-reflection layer and the anti-fingerprint layer and in direct contact with the anti-fingerprint layer, the intermediate layer comprising an inorganic insulating material having a columnar crystal structure with columns extending in a thickness direction of the window.

2. The window of claim 1, wherein the inorganic insulating material having the columnar crystal structure comprises silicon oxide.

3. The window of claim 1, wherein the anti-reflection layer has a stack structure comprising a plurality of sub-layers, and
the plurality of sub-layers comprise a first sub-layer comprising a first inorganic insulating material and a second sub-layer comprising a second inorganic insulating material that is different from the first inorganic insulating material.

4. The window of claim 3, wherein the anti-reflection layer has a structure in which the first sub-layer and the second sub-layer are alternately stacked.

5. The window of claim 3, wherein the first sub-layer is disposed at an uppermost portion of the anti-reflection layer and comprises an oxide.

6. The window of claim 3, wherein the first sub-layer comprises an inorganic insulating material having a crystal structure that is different from the columnar crystal structure of the inorganic insulating material of the intermediate layer.

7. The window of claim 3, wherein a density of the intermediate layer is less than a density of the first sub-layer.

8. The window of claim 3, wherein a thickness of the intermediate layer is about 1 nanometers (nm) to about 50 nm, and a thickness of the first sub-layer is about 10 nm to about 500 nm.

9. The window of claim 1, wherein a refractive index of the intermediate layer is about 1.2 to about 1.7.

10. A display panel comprising:
a substrate;
a display element arranged in a display area of the substrate, the display element comprising a first electrode, a second electrode, and an emission layer between the first electrode and the second electrode;
an encapsulation member disposed on the display element; and
a window disposed on the encapsulation member,
wherein the window comprises:
a window substrate;
an anti-reflection layer disposed on the window substrate;
an anti-fingerprint layer disposed on the anti-reflection layer; and
an intermediate layer between the anti-reflection layer and the anti-fingerprint layer and in direct contact with the anti-fingerprint layer, the intermediate layer comprising an inorganic insulating material having a columnar crystal structure with columns extending in a thickness direction of the window.

11. The display panel of claim 10, wherein the inorganic insulating material having the columnar crystal structure comprises silicon oxide.

12. The display panel of claim 10, wherein the anti-reflection layer has a stack structure comprising a plurality of sub-layers, and
one of the plurality of sub-layers comprises an inorganic insulating material having a crystal structure that is different from the columnar crystal structure of the inorganic insulating material of the intermediate layer.

13. The display panel of claim 10, wherein the anti-reflection layer has a structure in which a first sub-layer and a second sub-layer are alternately stacked.

14. The display panel of claim 13, wherein the first sub-layer is disposed at an uppermost portion of the anti-reflection layer, and the first sub-layer and the intermediate layer comprise a same element.

15. The display panel of claim 14, wherein a material of the first sub-layer has a crystal structure that is different from the columnar crystal structure of the inorganic insulating material of the intermediate layer, and a density of the intermediate layer is less than a density of the first sub-layer.

16. The display panel of claim 14, wherein a thickness of the intermediate layer is less than a thickness of the first sub-layer.

17. The display panel of claim 14, wherein a thickness of the intermediate layer is about 1 nm to about 50 nm, and a thickness of the first sub-layer is about 10 nm to about 500 nm.

18. The display panel of claim 10, wherein a refractive index of the intermediate layer is about 1.2 to about 1.7.

19. An electronic device comprising:

a display panel comprising a display element arranged in a display area of a substrate, and a window disposed on the display element; and a housing, which accommodates the display panel, wherein the window comprises:

a window substrate;

an anti-reflection layer disposed on the window substrate;

an anti-fingerprint layer disposed on the anti-reflection layer; and an intermediate layer between the anti-reflection layer and the anti-fingerprint layer and in direct contact with the anti-fingerprint layer, the intermediate layer comprising an inorganic insulating material having a columnar crystal structure with columns extending in a thickness direction of the window.

20. The electronic device of claim 19, wherein the inorganic insulating material having the columnar crystal structure comprises silicon oxide.

21. The electronic device of claim 19, wherein the anti-reflection layer has a stack structure comprising a plurality of sub-layers, and the plurality of sub-layers comprise a first sub-layer comprising a first inorganic insulating material and a second sub-layer comprising a second inorganic insulating material that is different from the first inorganic insulating material.

22. The electronic device of claim 21, wherein the first sub-layer comprises an inorganic insulating material having a crystal structure that is different from the columnar crystal structure of the inorganic insulating material of the intermediate layer.

23. The electronic device of claim 22, wherein the inorganic insulating material of the first sub-layer and the inorganic insulating material of the intermediate layer comprise a same element.

24. The electronic device of claim 22, wherein a density of the intermediate layer is less than a density of the first sub-layer.

25. The electronic device of claim 22, wherein a thickness of the intermediate layer is less than a thickness of the first sub-layer.

26. The electronic device of claim 22, wherein a thickness of the intermediate layer is about 1 nm to about 50 nm, and a thickness of the first sub-layer is about 10 nm to about 500 nm.

27. The electronic device of claim 19, wherein a refractive index of the intermediate layer is about 1.2 to about 1.7.

* * * * *